United States Patent [19]

Nakajima et al.

[11] Patent Number: 4,477,686

[45] Date of Patent: Oct. 16, 1984

[54] THERMOELECTRIC ELEMENT

[75] Inventors: Takashi Nakajima, Chiba; Makoto Suzuki, Tokyo, both of Japan

[73] Assignee: TDK Corporation, Tokyo, Japan

[21] Appl. No.: 427,669

[22] Filed: Sep. 29, 1982

[30] Foreign Application Priority Data

Dec. 2, 1981 [JP] Japan .......................... 56-178787[U]
Dec. 28, 1981 [JP] Japan .......................... 56-193302[U]

[51] Int. Cl.³ .......................................... H01L 35/28
[52] U.S. Cl. .................................. 136/203; 73/27 R; 136/206
[58] Field of Search ................. 136/203, 206; 73/27 R

[56] References Cited

U.S. PATENT DOCUMENTS 3,956,017 5/1976 Shigemasa ...................... 136/206 X
4,243,855 1/1981 Agouridis et al. ................ 357/61 X
4,292,579 9/1981 Constant ......................... 136/203 X
4,322,968 4/1982 Takami et al. ..................... 73/27 R Primary Examiner—Leland A. Sebastian
Attorney, Agent, or Firm—Robert Scobey

[57] ABSTRACT

A thermoelectric element wherein connecting members for effecting electrical connection and mechanical engagement are attached securely to the cold-end portion of a thermoelectric elemental body consisting of a p-type semiconductor and an n-type semiconductor joined with each other to form a pn junction therebetween. A support member surrounds the end portion.

9 Claims, 19 Drawing Figures

THERMOELECTRIC ELEMENT

BACKGROUND AND BRIEF DESCRIPTION OF THE INVENTION

The present invention relates to a thermoelectric element, and particularly to effecting electrical connection and mechanical engagement with a thermoelectric elemental body formed of thermoelectric semiconductors.

Compared with a metallic thermocouple, a thermoelectric element employing semiconductors of iron silicide ($FeSi_2$) produces a higher output voltage and has a relatively greater internal resistance, as shown in Table 1 below.

TABLE 1

|  | Thermocouple | Thermoelectric element |
|---|---|---|
| Output voltage (mV) | up to 20 | up to 350 |
| Internal resistance (m$\Omega$) | approx. 10 | approx. 1000 |

In the case of a thermocouple, it is eventually necessary, due to the low output voltage and the small internal resistance thereof, to reduce the contact resistance in transmitting output electric energy to an external apparatus while giving adequate consideration to the electrical junction, including the connection of lead wires.

FIG. 1 shows an equivalent circuit with the output voltage V0 of a thermocouple or thermoelectric element, its internal resistance Rin and the resistance Rc in the connection of a load Rl. The voltage VRl applied across the load is expressed as $$VRl = \frac{Rl}{Rin + 2Rc + Rl} \cdot V0$$

$$= \frac{1}{\frac{Rin}{Rl} + \frac{2Rc}{Rl} + 1} \cdot V0$$

Assuming now that a metallic thermocouple has circuit constants of Rin=10 m$\Omega$, Rl=10 m$\Omega$, and Rc=5 m$\Omega$, $$VRl \frac{1}{1 + 1 + 1} \cdot V0 = \frac{1}{3} V0$$

Thus, the voltage VRl actually applied across the load is decreased to one-third of the output voltage V0; as a result, insufficient electric energy is transmitted to an external device.

In the case of a thermoelectric element using semiconductors of iron silicide or the like and having circuit constants of Rin=1 $\Omega$, R1=1 $\Omega$, and Rc=5 m$\Omega$, the following results:

$$VRl \frac{1}{1 + \frac{0.005}{1} + 1} \cdot V0 \sim \frac{1}{2} V0$$

Consequently, ample electric energy results from the thermoelectric element without any substantial adverse influence of the resistance Rc.

It will be evident from the above that, as compared with a metallic thermocouple, a thermoelectric element employing semiconductors of iron silicide or the like has a greater degree of freedom with regard to the connection of lead wires and the like.

However, there exist some difficulties in using such a thermoelectric element, particularly with regard to mechanical engagement therewith and lead wire connection thereto.

In each of a thermocouple and a thermoelectric element, the output voltage V0 generated is substantially proportional to the difference between the hot-junction temperature THi and the cold-junction temperature Tc. This relationship can be expressed as follows with respect to the Seebeck coefficent $\alpha$ of the thermoelectric material used and the temperature difference $\Delta T$:

$$V0 \propto \alpha \Delta T$$

Where $\Delta T = THi - Tc$

To attain a high output voltage V0, it is thus necessary to minimize the cold-junction temperature Tc (to maximize the temperature difference $\Delta T$ between Tc and THi). Accordingly, in the case of a thermoelectric element, its electrode structure needs to be designed properly with sufficient consideration given to the cooling effect. With regard to such relationship, Table 2 below lists a comparison between a thermoelectric element and a thermocouple.

TABLE 2

|  | Material Thermal Conductivity | Material resistance | Exterior shape | Cooling |
|---|---|---|---|---|
| Thermocouple | Metal High | Small | Thin and long | Adequate with lead wires |
| Thermoelectric element | Semiconductor Low | Great | Thick and short | Cooling effect influential |

It will be understood from the above that, as compared with a thermocouple, satisfactory cooling at the cold-end portion should be executed in a thermoelectric element where electric energy is obtained from the transfer of a great amount of heat.

The present invention has been accomplished in view of the above circumstances and its object resides in providing an improved thermoelectric element wherein connecting members such as lead tabs are attached securely to the cold-end portion of a thermoelectric elemental body consisting of a p-type semiconductor and an n-type semiconductor joined with each other to form a pn junction therebetween so that both electrical connection and mechanical engagement are achievable simultaneously to offer convenience for mounting and replacement. In particular, a mechanical support member is anchored so as to surround the cold-end portion, hence achieving both electrical connection and mechanical engagement with certainty while realizing efficient cooling and thermal radiation simultaneously to offer convenience for mounting and replacement of the element.

The invention will be more completely understood by reference to the following detailed description of embodiments thereof, taken with the accompanying drawings.

BRIEF DESCRIPTION OF THE DRAWINGS

In FIGS. 2 and 3, a thermoelectric elemental body 1 consists of a p-type semiconductor 2A and an n-type semiconductor 2B preferably composed of sintered iron silicide and joined together to form a pn junction 3 therebetween. The two semiconductors are insulated from each other through a gap 4, with the exception of the region where the pn junction is present, and the cold-end portion of the elemental body 1 serves as an electrode region to feed an ouput therefrom. Connecting members 5A and 5B typically composed of tin-plated copper pieces and shaped at front ends thereof into tab terminals are attached securely to the cold-end portion by ultrasonic soldering or spot welding, e.g., and a heat-resistant insulating ceramic binder 6 is provided for mechanical reinforcement and electrical insulation. Further, the end portion is covered with a metal case 7. The assembly constitutes a thermoelectric element 10 with a pair of the connecting members 5A and 5B united to form a plug-like structure.

A socket 20 fittable to the plug-like connecting members 5A and 5B has a pair of support blades 21A and 21B composed of a flexible metal, and lead wires 22A and 22B are connected thereto, respectively. FIG. 4 is a perspective view of the socket 20, wherein a pair of insertion holes 24A and 24B are formed in a front insulator plate 23, and a mounting case 25 is anchored to a chassis 27 by means of screws 26.

The above structure exhibits the following advantages:

(1) Due to the integrated plug-like formation of the connecting members 5A and 5B at the cold-end portion of the elemental body 1, the thermoelectric element 10 is mountable merely by inserting the members 5A and 5B into the holes 24A and 24B of the socket 20 located on some apparatus for use. That is, electrical connection is completed upon pressed contact of the connecting members 5A and 5B with the support blades 21A and 21B of the socket 20, and simultaneously mechanical engagement of the thermoelectric element 10 is achieved as well. This structure also facilitates replacement of the element 10;

(2) Cooling is improved, as the connecting members 5A and 5B are disposed at the cold-end portion of the elemental body 1; and (3) By standardizing the shapes and dimensions of the elemental body 1, the connecting members 5A, 5B and the socket 20, it becomes possible to achieve greater efficiencies in mass production and greater convenience in mounting and replacing the element on a device in use.

Figure 1:
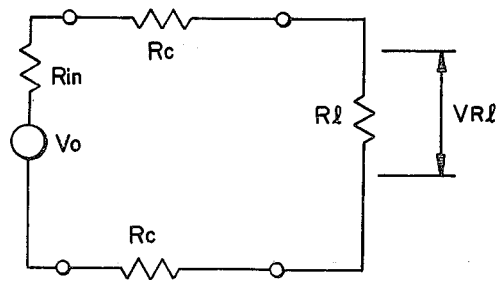
FIG. 1 is an equivalent circuit diagram for calculating the voltage applied across a load of a metallic thermocouple or a thermoelectric element.
Figure 2:
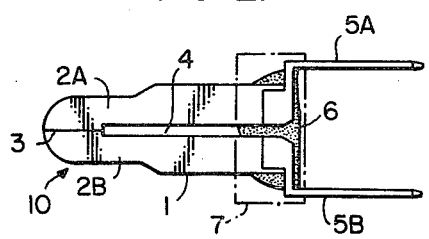
FIG. 2 is a plan view of an exemplary thermoelectric element embodying the present invention.
Figure 3:
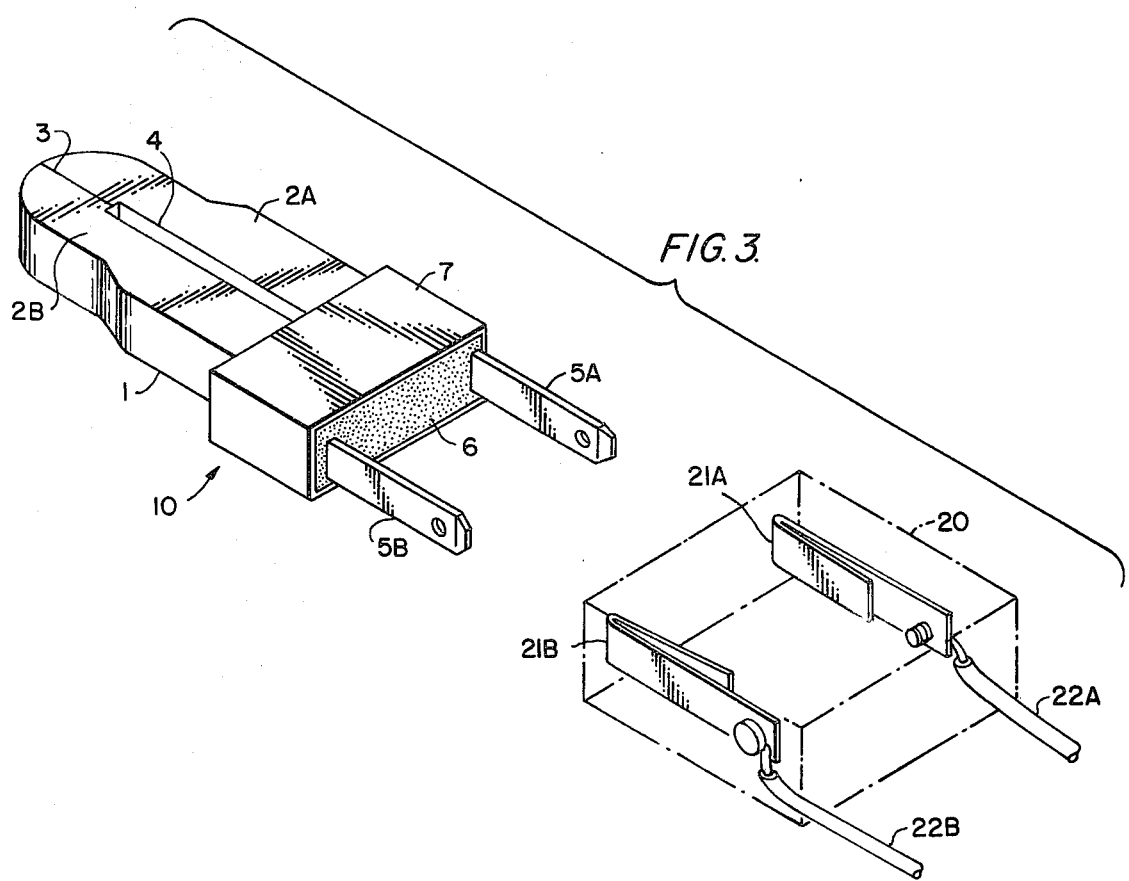
FIG. 3 is a perspective view of the thermoelectric element shown in FIG. 2.
Figure 4:
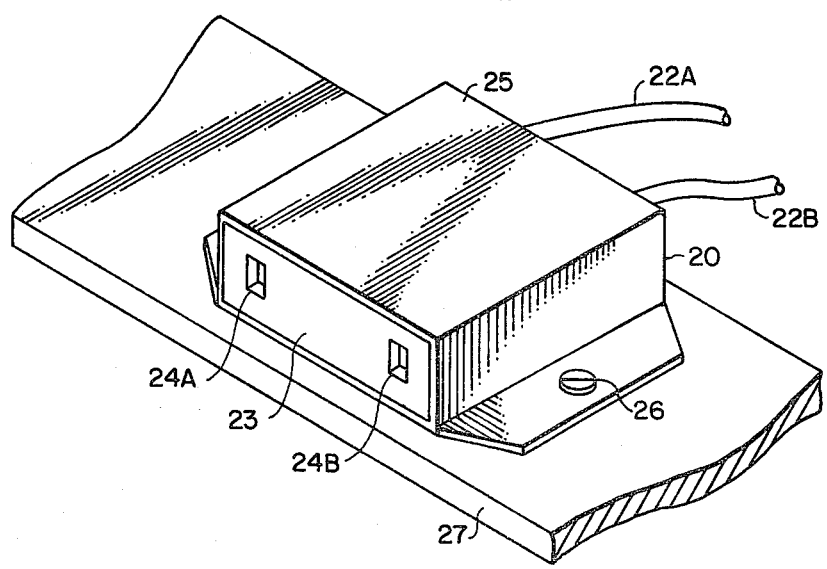
FIG. 4 is a perspective view of an exemplary socket to hold the thermoelectric element through engagement therewith.
Figure 5:
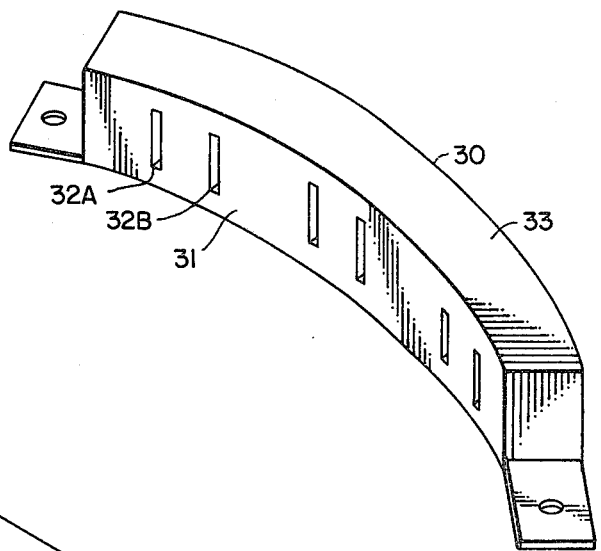
FIG. 5 is a perspective view of a modified socket.

FIG. 5 illustrates a modified socket 30 designed to securely hold a plurality of thermoelectric elements 10 shown in FIGS. 2 and 3. In this modification, pairs of insertion holes 32A and 32B are formed in a front insulator plate 31 of the socket 30, and both the insulator plate 31 and a case 33 are curved arcuately so that the respective front ends of the thermoelectric elements 10 are arrayed to form a circular arc, thereby ensuring efficient heating with flame from a gas burner or the like. This socket 30 is also advantageously anchored on the mounting plate of an apparatus by means of screws.

Figure 6:
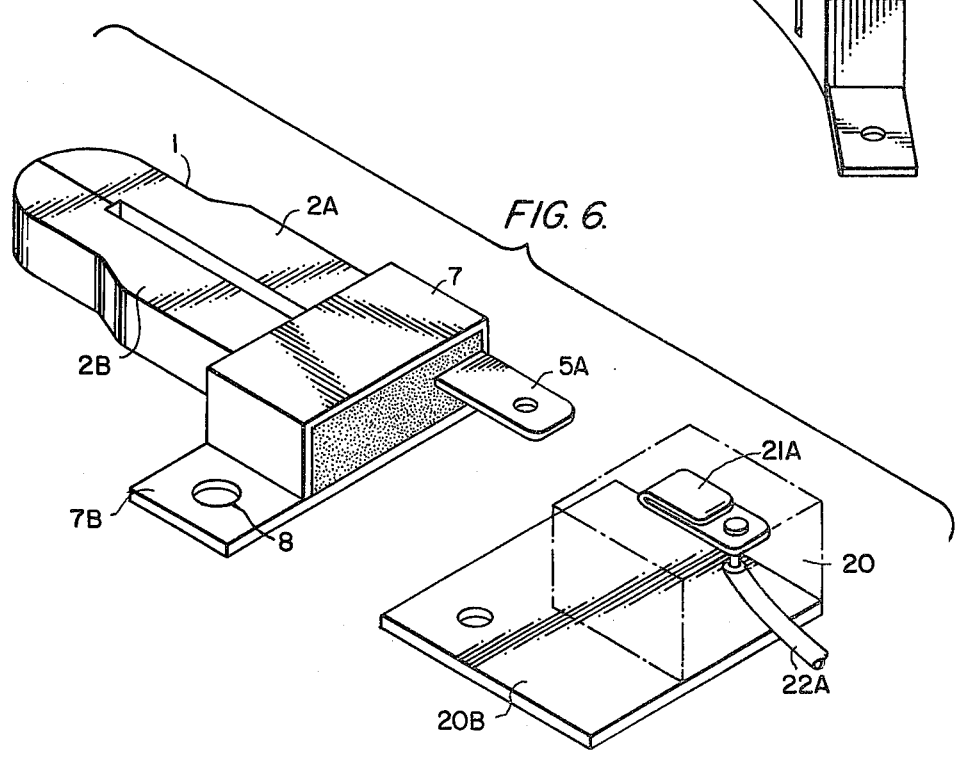
FIG. 6 is a perspective view of another exemplary thermoelectric element according to the invention.

FIG. 6 is a perspective view illustrating another exemplary embodiment of the invention, wherein the cold-end portion of a p-type semiconductor 2A is attached securely to a connecting member 5A as in the foregoing embodiment of FIG. 3, while the cold-end portion of an n-type semiconductor 2B is attached securely to a metal case 7. The case 7 has a tongue 7B formed integrally therewith and corresponding to the connecting member 5B in the embodiment of FIG. 3. A mounting screw hole 8 is formed in the tongue 7B for permitting secure attachment to a chassis 20B which is to be utilized as one electrical potential. Such attachment readily completes both electrical connection and mechanical engagement of the thermoelectric element 10. In the arrangement where the socket 20 is disposed on the chassis 20B, connection of the other member 5A with the corresponding support blade 21A is attained simultaneously. This embodiment is particularly advantageous when employed in any apparatus operating with frequent vibrations, and thermal radiation at the cold-end portion is further expedited to enable generation of a greater electromotive force as a result.

Figure 7:
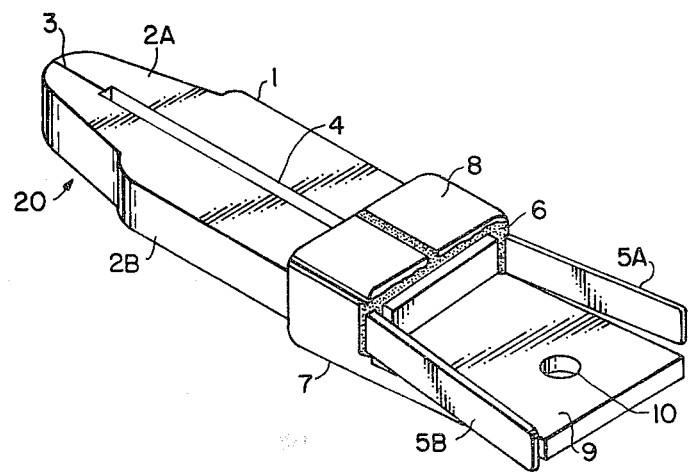
FIG. 7 is a perspective view of still another thermoelectric element embodying the present invention.
Figure 8:
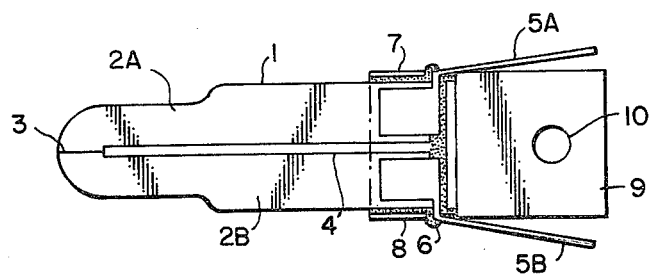
FIG. 8 is a sectional plan view of the element shown in FIG. 7.

FIGS. 7 and 8 show another form of thermoelectric element embodying the invention. A thermoelectric elemental body 1 preferably of a p-type semiconductor 2A and an n-type semiconductor 2B, composed of sintered iron silicide, are joined together to form a pn junction 3 therebetween. The two semiconductors are insulated from each other through a gap 4 with the exception of the region where the pn junction 3 is present, and the cold-end portion of the elemental body 1 serves as an electrode region to feed an output therefrom. Lead tabs 5A and 5B typically of tin-plated copper pieces are attached securely to the end portion for effecting both electrical connnection and thermal radiation. It is preferred that the lead tabs have large areas of contact and be anchored by welding, for example, to the ultrasonic soldering surface of the thermoelectric elemental body 1. Furthermore, support member 7 for effecting mechanical lock is attached securely to the cold-end portion of the elemental body 1 with a heat-resistant insulating ceramic binder 6 included so as to surround the end portion. The support member 7 is preferably composed of aluminum treated to become Alumite with an insulating oxide layer formed on its surface, and has a holding region 8 surrounding the cold-end portion of the elemental body 1 and a mounting region 9 extending between the lead tabs 5A and 5B with a mounting hole 10 formed therethrough. Since the surface of the support member 7 is covered with an insulating oxide layer, the ceramic binder 6 is formable into an extremely thin film so that the support member 7 can execute satisfactory thermal radiation.

Thus, a thermoelectric element 20 is constituted by the provision of an integrated assembly of the lead tabs 5A, 5B for electrical connection and the support member 7 for mechanical lock, wherein electric wiring to the tabs 5A and 5B is completed by the use of suitable connector means such as a receptacle to obtain a required electric energy therefrom. The element 20 can be set fixedly on an apparatus with a screw or rivet by utilizing the through hole 10 formed in the support member 7.

The structure of the above-described embodiment is effective in attaining the following advantages:

(1) Due to the integrated formation of the lead tabs 5A, 5B and the support member 7 at the cold-end portion of the elemental body 1, both electric wiring and mounting are facilitated;

(2) Cooling is enhanced since the lead tabs 5A, 5B and the support member 7 function as thermal radiators;

(3) The use of an Alumite-finished aluminum plate for the support member 7 minimizes, because of the present of the insulating oxide film on the surface, the thickness of the ceramic binder layer 6 formed between the cold-end portion of the thermoelectric elemental body 1 and the support member 7 surrounding the same, thereby further improving cooling; and (4) By standardizing the shapes and dimensions of the elemental body 1, the lead tabs 5A, 5B and the support member 7, it becomes possible to achieve greater efficiencies in mass production and greater convenience in mounting and replacing the element.

Figure 9:
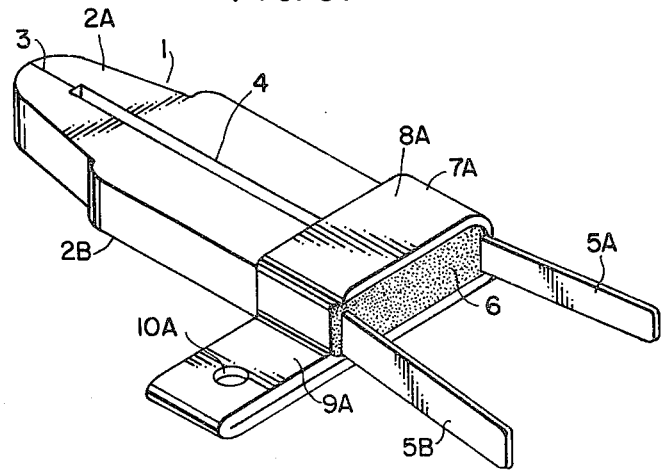
FIG. 9 is a perspective view of yet another thermoelectric element according to the invention.

FIG. 9 illustrates another embodiment of the invention similar in some respects to FIG. 6, wherein a support member 7A has a holding region 8A surrounding the cold-end portion of a thermoelectric elemental body 1, and a mounting region 9A extending laterally from the elemental body 1 with the mounting hole 10A formed therethrough. The attachment and the structure of lead tabs 5A and 5B are exactly the same as those in FIGS. 7 and 8.

Figure 10:
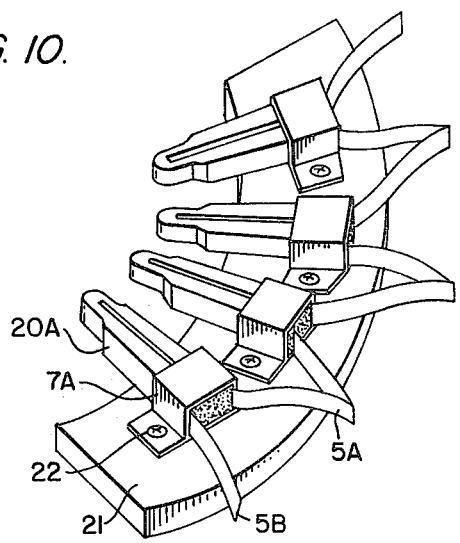
FIG. 10 is a perspective view of an exemplary arrangement where a plurality of thermoelectric elements of the invention are arrayed.

FIG. 10 illustrates an exemplary arrangement of a plurality of thermoelectric elements of the type of FIG. 9 arrayed arcuately in accordance with the shape of a device in use. In this arrangement, the elements 20A are anchored with screws 22 on an arcuate mounting plate 21 serving also as a thermal radiator, and are assembled to constitute a unit through electrical serial connection of the respective adjacent lead tabs 5A and 5B joined mutually by welding, soldering, clamping or calking. Electric coupling to an external device is achieved by fitting suitable connector means such as a receptacle to the final lead tabs.

By employing thermoelectric elements 20(FIG.7) or 20A(FIG.10) each equipped with integrated lead tabs and support member, the user is permitted easily and readily to selectively assemble the individual elements, thereby constituting a unit and standardizing the same as a component part.

Figure 11:
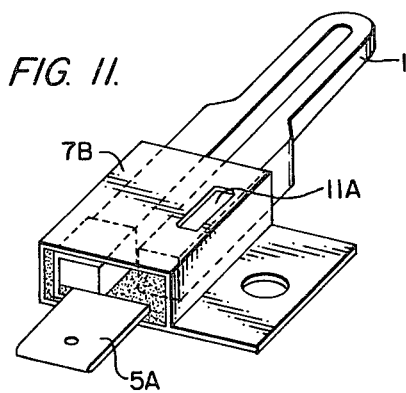
FIG. 11 is a perspective view of another thermoelectric element embodying the invention.

Differing from the foregoing embodiment where a pair of lead tabs 5A and 5B are disposed to serve as positive and negative electrodes of the thermoelectric elemental body 1, the support member may also be used as one electrode while merely a single lead tab is provided, as illustrated in FIG. 11 (similar to the embodiment of FIG. 6). In this modification, the support member 7B has an elastic tongue 11A on its upper surface and a protrusion on its lower surface so that one end of the elemental body 1 is held elastically by the tongue and the protrusion. The other end of the elemental body 1 is connected to the lead tab 5A while being isolated from the support member 7B. The space between the support member 7B and the elemental body 1 is filled with an insulator material such as ceramic binder so as to set the elemental body and support member firmly together. Such a structure simplifies assembly to enhance operational efficiency.

Each lead tab may be marked for polarity recognition to render the wiring more accurate and distinct, as desired.

Figure 12:
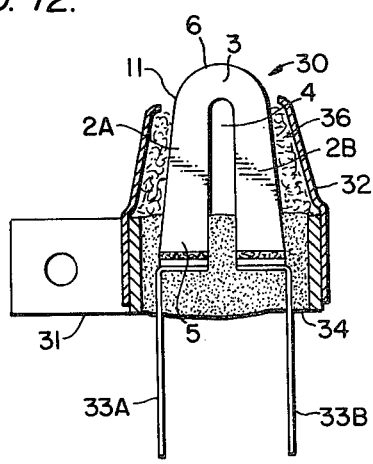
FIG. 12 is a sectional plan view of still another thermoelectric element embodying the invention.

FIG. 12 illustrates another embodiment of the invention, wherein a thermoelectric element 30 comprises an elemental body 11 which consists preferably of a p-type semiconductor 2A and an n-type semiconductor 2B of sintered iron silicide joined together to form a pn junction therebetween and insulated from each other through a gap 4 except in the region of the pn junction 3. A support member 31 is included for firmly holding and cooling the cold-end portion 5 of the elemental body 11, and a cylindrical heat shield plate 32 surrounds the elemental body 11 so as to expose only the hot-end portion 6 of the elemental body 11. Lead tabs 33A and 33B serving as both electrode terminals and radiation plates are anchored to the cold-end portion 5 of the elemental body 11 by welding or the like. The support member 31 for effecting mechanical lock is fixed in such a manner as to surround the cold-end portion 5 with a ceramic or similar binder 34 which is thermally conductive but electrically nonconductive. The cylindrical heat shield plate 32 is anchored to the support member 31 with a binder or the like. When necessary, the support member 31 may be disposed on the heat sink as well. The shield plate 32 preferably may be either a thin metal plate finished to have a glossy surface or a heat insulator plate containing glass wool or the like. The space between the elemental body 11 and the shield plate 32 may be filled with a soft heat insulator 36 such as glass wool for promoting thermal insulation as well as for alleviating the harmful influence of heat distortion.

In this embodiment, the presence of the cylindrical shield plate 32 is effective in thermally isolating the cold-end portion 5 of the thermoelectric elemental body 11, to prevent the temperature at the cold-end portion 5 being raised by radiant heat or the convection of heated air from the heated hot-end portion. Furthermore due to the unified structure of the elemental body 11, the support member 31 and the cylindrical shield plate 32, the element is mountable with facility and offers great convenience in practical use.

Figure 13:
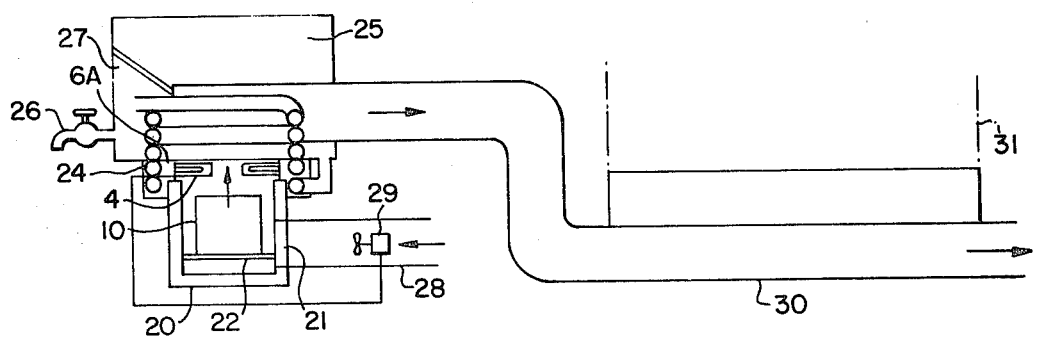
FIG. 13 shows a solid fuel burner incorporating a thermoelectric element of the type of the present invention.
Figure 14:
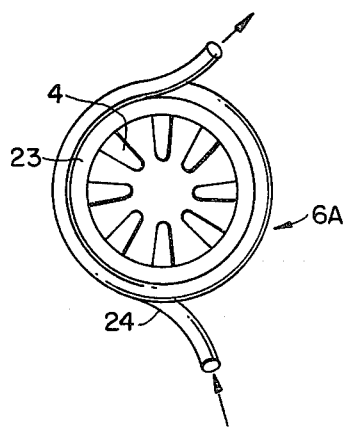
FIG. 14 shows a thermoelectromotive force unit used in the burner of FIG. 13.

FIG. 13 shows one form of practical application of the present invention. In this drawing, a solid fuel burner 20 is provided with an air inlet hole 21 at its lower side portion, and has a porous supporting block 22 therein. At the upper, open end of the solid fuel burner 20 is arranged a thermoelectromotive force unit 6A which has a number of thermoelectric elements 4 installed, as shown in FIG. 14, at an inner circumference of an annular cooling unit 23. In this case, the cooling unit 23 for the thermoelectromotive force unit 6A is of the water-cooled type, and has an annular wound water pipe 24. One end of the water pipe 24 is connected to a water tank 25; the other end is connected to a hot water storage tank 27 having a faucet 26. To the inlet port 21 of the solid fuel burner 20 is connected a suction (air inlet) pipe 28. An air suction fan 29 is arranged in the pipe 28, and an output from the thermoelectromotive force unit 6A is supplied to the air suction fan 29. An exhaust pipe 30 extending from the solid fuel burner 20 passes beneath the floor of a dwelling 31 so as to form a floor heater. On the supporting block 22 is installed either a briquette 10 or coal as a solid fuel.

Figure 15:
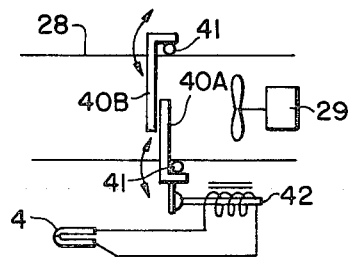
FIG. 15 shows an overheating prevention mechanism installed in the air suction pipe of the burner of FIG. 13.

In the air suction pipe 28 for the solid fuel burner 20 may be installed an overheating prevention mechanism as shown in FIG. 15. More specifically, the overheating prevention mechanism is constructed such that a pair of air flow adjustor valves 40A, 40B are pivotally arranged at fulcrum points of pins 41 in the air suction pipe 28. The air flow adjustor valve 40A is connected to a solenoid-actuated plunger 42, and one of the thermoelectric elements 4 of the thermoelectromotive force unit 6A is used as an exciting source for the solenoid-actuated plunger. The other air flow adjustor valve 40B mechanically cooperates with the air flow adjustor valve 40A. Under this arrangement, if a combustion temperature is lower than a predetermined value, the solenoid-actuated plunger 42 is not energized sufficiently to move the plunger so that the plunger is kept projected out of its case under the force of a spring therein to keep the air flow adjustor valves 40A, 40B opened. When the combustion temperature exceeds a predetermined value, the solenoid-actuated plunger 42 is energized sufficiently to retract the plunger so as to close the air flow adjustor valves 40A, 40B and restrict the combustion.

According to this arrangement, the combustion efficiency of a solid fuel may be improved; at the same time, floor heating in a dwelling effectively may be realized. The water supplied to the water pipe 24 to cool the thermoelectromotive force unit 6A is heated while it is passed therethrough. The hot water is stored in the hot water storage tank 27, so that the tank efficiently may be used as a hot water supply device.

Figure 16:
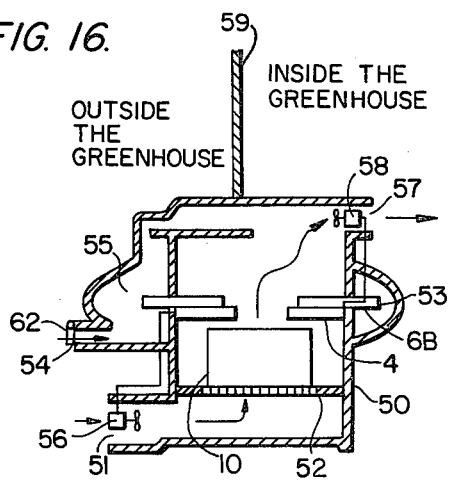
FIG. 16 shows another solid fuel burner incorporating a thermoelectric element of the type of the present invention.

FIG. 16 illustrates another practical application of the present invention. In this figure, a solid fuel burner 50 has an air inlet port 51 at its lower side portion, and also has a porous supporting block 52 therein. Over the solid fuel burner 50 is arrange a thermoelectromotive force unit 6B having a number of thermoelectric elements 4 arranged in an annular cooling fin 53. In this arrangement, the solid fuel burner 50 is formed with a surrounding air inlet port 54 and a surrounding air supply passage 55, and the cooling fin 53 for the thermo-electromotive force unit 6B is projected into the surrounding air supply passage 55. To the surrounding air inlet port 54 is fixed an air flow adjustor damper 62. To the air inlet port 51 is arranged an air suction fan 56, and to an air discharge port 57 is arranged an air discharging fan 58. To these fans 56, 58 is supplied an output of the thermoelectromotive force unit 6B. On the supporting block 52 is placed either a briquette 10 or coal as a solid fuel.

Figure 17:
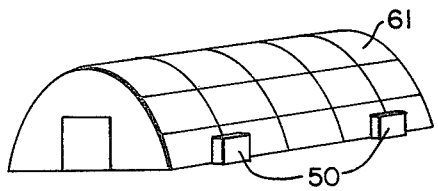
FIG. 17 shows a greenhouse in which the burner of FIG. 16 is installed.

Solid fuel burner 50 shown in FIG. 16 is installed at a wall surface of a greenhouse 61 as illustrated in FIG. 17. Reference numeral 59 in FIG. 16 indicates a wall of the greenhouse.

Figure 18:
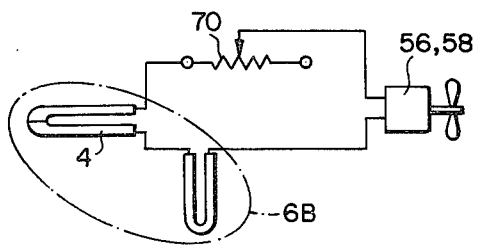
FIG. 18 shows a variable air flow device which may be installed in the burner of FIG. 16.

Variable air flow device shown in FIG. 18 may be installed in the arrangement illustrated in FIG. 16. The variable air flow device is constructed such that a variable resistor 70 is inserted between either an air suction fan 56 or air discharge fan 58 and the thermoelectromotive force unit 6B. Speed of the fan can be varied to modify air flow rate by varying the resistance of the variable resistor 70.

According to this arrangement, it is possible to improve combustion efficiency of solid fuel and further to provide effective heating of the greenhouse 61 (which may be in a location where a commercial power supply is unavailable), since the combustion air and the surrounding air are mixed with each other and then fed into the greenhouse 61 by the air discharging fan 58. Further, an application of the variable air flow device shown in FIG. 18 may enable an adjustment of heating time and combustion time ranging from a low temperature, longer hours combustion to a high temperature, shorter shours combustion by either increasing or decreasing air flow rate.

Figure 19:
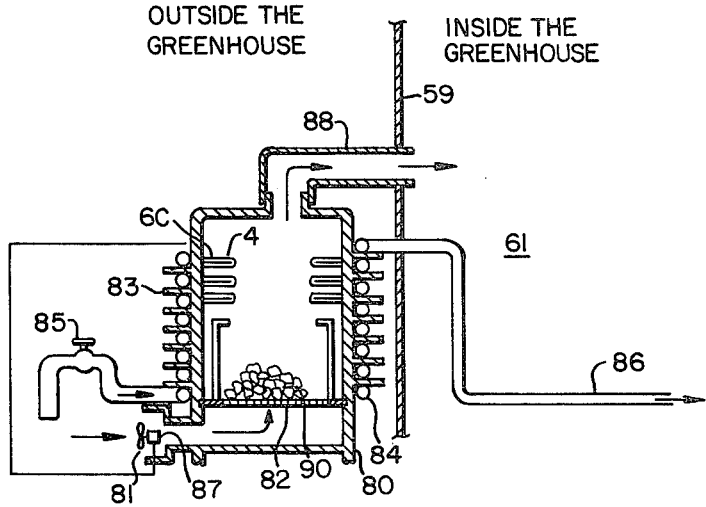
FIG. 19 shows yet another solid fuel burner incorporating a thermoelectric element of the type of the present invention.

FIG. 19 illustrates another practical application of the present invention. A solid fuel burner 80 has an air inlet port 81 at its lower side portion and has a porous supporting block 82 therein. Over the solid fuel burner 80 is arranged a thermoelectromotive force unit 6C in which a number of thermoelectric elements 4 are inserted at the inner circumference of a cylindrical cooling unit 83 (also used as an outer wall for the solid fuel burner 80). In this arrangement, the cooling unit 83 for the thermoelectromotive force unit 6C is of a water-cooled structure and has an annular wound water pipe 84 at its circumference. One end of the water pipe 84 is connected to faucet 80; the other end is connected to hot water heater pipe 86 passing through greenhouse wall 59. In the air inlet port 81 of the solid fuel burner 80 is arranged an air suction fan 87, and an output from the thermoelectromotive force unit 6C is suppled to this air suction fan. The air discharge pipe 88 extending from the solid fuel burner 80 is passed through the greenhouse wall 59 so as to feed the heated air into the greenhouse 61. On the supporting block 82 is placed solid fuel 90 such as coal, oval briquette, or the like.

According to this scheme, the combustion efficiency of solid fuel may be improved, the water supplied to the water pipe 84 which cools the thermoelectromotive force unit 6C is heated during its passage and the hot water is supplied to the hot water heating pipe 86, so that an effective heating of the greenhouse may be achieved.

As described above, according to the present invention, a mechanical support member is disposed so as to surround the cold-end portion of an elemental body, consisting of thermoelectric semiconductors, to enhance electrical connection, mechanical lock, thermal radiation, and heat shielding.

It will be appreciated that the embodiments disclosed herein may be modified. Thus the invention should be taken as defined by the following claims.

We claim:

1. A thermoelectric element for providing electrical energy through heat transfer comprising:
   a thermoelectric elemental body having a P-type semiconductor leg and an N-type semiconductor leg coupled directly together at one extreme end of said body;
   an insulation binder for fixing said P-type semiconductor leg and said N-type semiconductor leg at another extreme end of said body,
   a mechanical support member of heat transfer material surrounding said insulation binder, for supporting said elemental body and radiating heat from the element, and
   at least one terminal coupled with at least one of said semiconductor legs, for electrically coupling the element to an external circuit and radiating heat from the element.

2. A thermoelectric element as defined in claim 1, wherein said mechanical support member is anchored with a heat-resistant insulating binder surrounding the cold-end portion of said elemental body.

3. A thermoelectric element as defined in claim 1, wherein said mechanical support member has an insulating oxide layer on the surface thereof.

4. A thermoelectric element as defined in claim 1, wherein said p-type and n-type semiconductors are composed of a sintered material.

5. A thermoelectric element as defined in claim 1, wherein said mechanical support member serves also as an electrical terminal to effect an electrical connection.

6. A thermoelectric element as defined in claim 5, wherein said mechanical support member has, in a region thereof, an elastic tongue which anchors said support member to said cold-end portion and makes electrical connection to one of said semiconductors.

7. A thermoelectric element as defined in claim 1, wherein said mechanical support member comprises a generally cylindrical heat shield surrounding all of said elemental body except the p-n junction region thereof.

8. A thermoelectric element as defined in claim 7, wherein said heat shield is spaced from said elemental body, and the space therebetween is filled with a heat insulator.

9. A thermoelectric element as defined in claim 1, including tabs connected to the cold-end portions of said semiconductors for making electrical connection thereto and radiating heat therefrom.

* * * * *